United States Patent [19]

Knüttel

[11] Patent Number: 5,172,060
[45] Date of Patent: Dec. 15, 1992

[54] METHOD FOR RECORDING SPIN RESONANCE SPECTRA

[75] Inventor: Alexander Knüttel, Eggenstein-Leopoldshafen, Fed. Rep. of Germany

[73] Assignee: Bruker Medizintechnik GmbH, Rheinstetten-Forchheim, Fed. Rep. of Germany

[21] Appl. No.: 646,787
[22] PCT Filed: Apr. 27, 1990
[86] PCT No.: PCT/DE90/00309
  § 371 Date: Mar. 11, 1991
  § 102(e) Date: Mar. 11, 1991
[87] PCT Pub. No.: WO90/13826
  PCT Pub. Date: Nov. 15, 1990

[30] Foreign Application Priority Data
Apr. 29, 1989 [DE] Fed. Rep. of Germany ....... 3914351

[51] Int. Cl.$^5$ ............................................ G01R 33/20
[52] U.S. Cl. .................................... 324/307; 324/300
[58] Field of Search ............... 324/300, 307, 308, 309, 324/310, 311, 312, 313, 314, 318, 322; 128/653 A, 653 SO

[56] References Cited

U.S. PATENT DOCUMENTS

| | | | |
|---|---|---|---|
| 4,680,546 | 7/1987 | Dumoulin | 324/307 |
| 4,701,708 | 10/1987 | Hardy et al. | 324/311 |
| 4,706,024 | 11/1987 | Dumoulin | 324/309 |
| 4,922,203 | 5/1990 | Sillerud et al. | 324/307 |
| 4,987,369 | 1/1991 | Van Stapele et al. | 324/307 |

FOREIGN PATENT DOCUMENTS

347990 6/1989 European Pat. Off. .
3445689 6/1986 Fed. Rep. of Germany .

OTHER PUBLICATIONS

Book Sanders, Jeremy K. M. and Brian K. Hunter "Modern NMR Spectroscopy" Oxford University, 1987, pp. 237-259.
Book Wehrli, Felix W. Derek Shaw and J. Bruce Kneeland "Biomedical Magnetic Resonance Imaging", Verlag Chemie, 1988, pp. 1-45, 521-545.
Journal of Magnetic Resonance in Medicine, 9, 1989, pp. 254-260.
Journal of Magnetic Resonance 72 (1987) pp. 379-384.
Journal of Magnetic Resonance 78 (1988) pp. 355-361.
Journal of Magnetic Resonance 81 (1989), pp. 333-338.
Journal of Magnetic Resonance 67 (1986) pp. 148-155.
Journal of Magnetic Resonance 81 (1989) pp. 333-338.
Journal of Magnetic Resonance 76 (1988) pp. 380-385.
Journal of Magnetic Resonance in Medicine 3 (1986) pp. 90-96.
Journal of Magnetic Resonance 68 (1986) p. 367.
Journal of Magnetic Resonance 77 (1988) p. 596.

*Primary Examiner*—Michael J. Tokar
*Attorney, Agent, or Firm*—Rosenblum, Parish & Isaacs

[57] ABSTRACT

A method serves for recording nuclear resonance spectra of test samples having at least three groups of spins. A first group is coupled to a second group, while a third group is uncoupled relative to the second group but has a spectral position, e.g. chemical shift, which is substantially identical only to that of the first group. For obtaining an isolated image of the signal of the first group, one suppresses the signal of the third group. A pulse sequence of three r.f. pulses (10, 13, 22) are irradiated upon the sample in a manner known as such. The second r.f. pulse (13) is applied in such a way that the magnetization of the spins of the first group is transferred to the spins of the second group by polarization transfer. Then, a first magnetic gradient field pulse (17, 23), with dephasing effect for the spins of the said second group, is exerted upon the sample. The third r.f. pulse (22) is adjusted in such a way that the magnetization of the spins of the said second group is retransferred, by polarization re-transfer, to the spins of the first group, which is finally exposed to a second magnetic gradient field pulse (23), being rephasing for the spins of the first group (A).

37 Claims, 8 Drawing Sheets

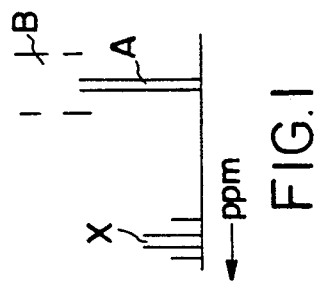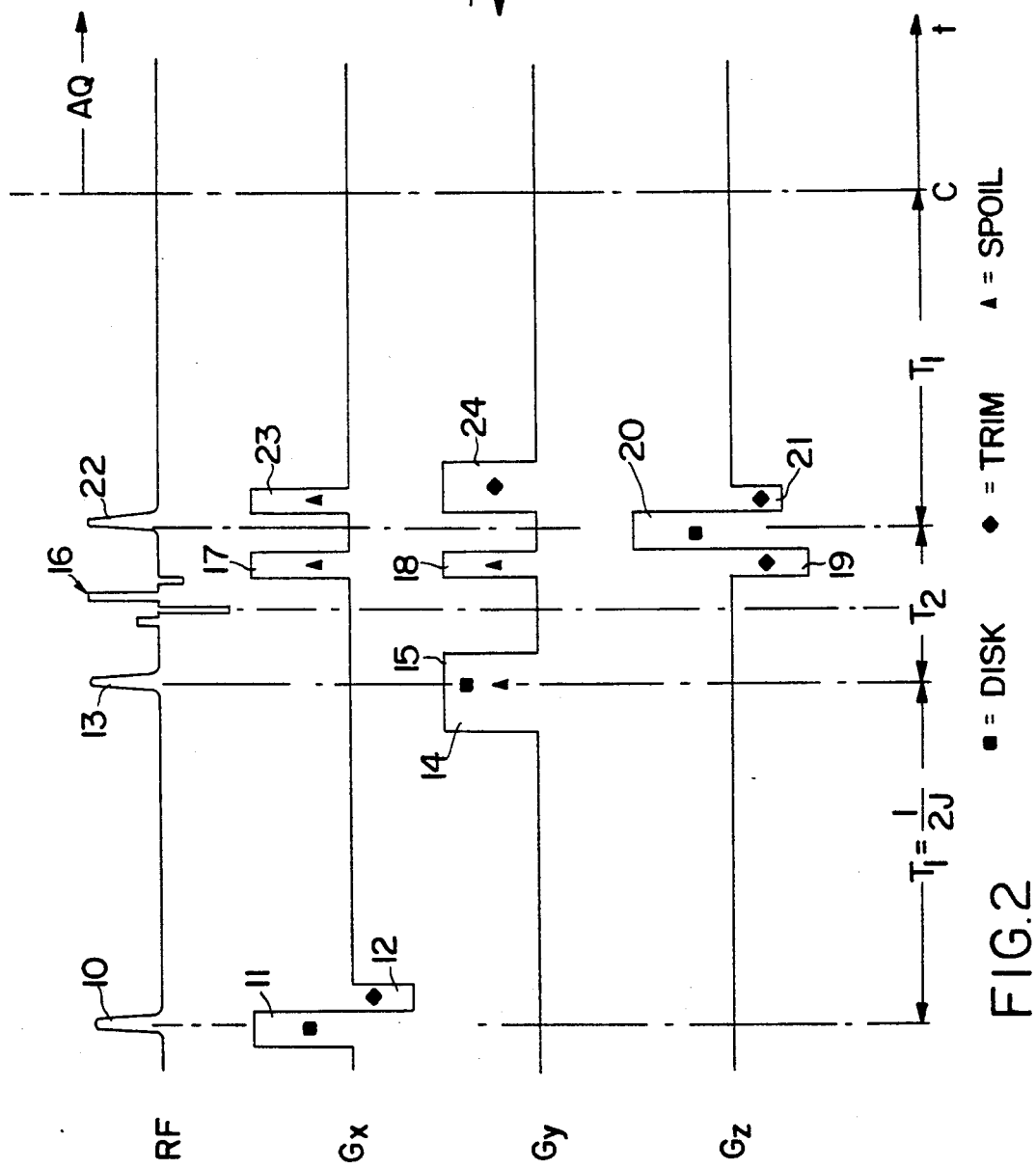

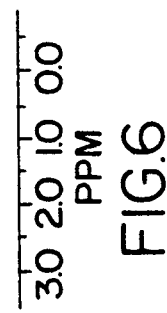
FIG.6
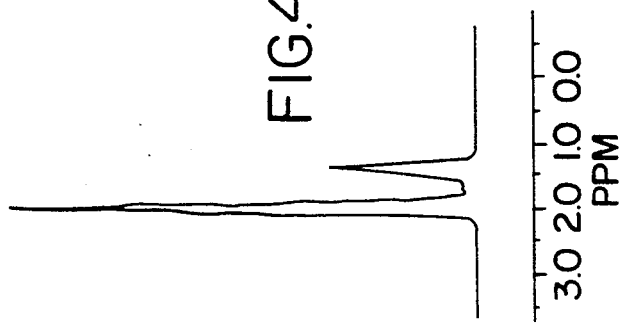
FIG.4
FIG.5
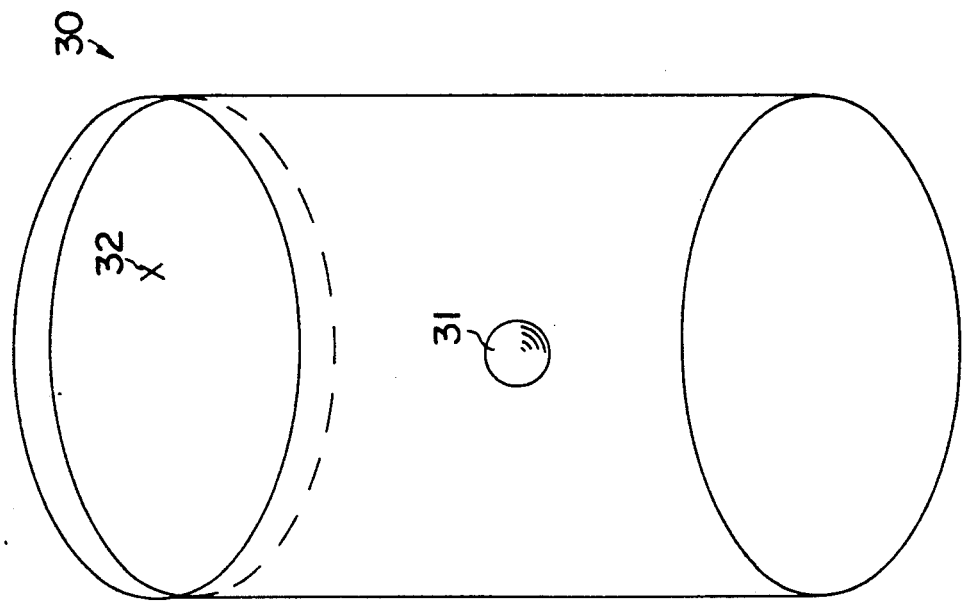
FIG.3

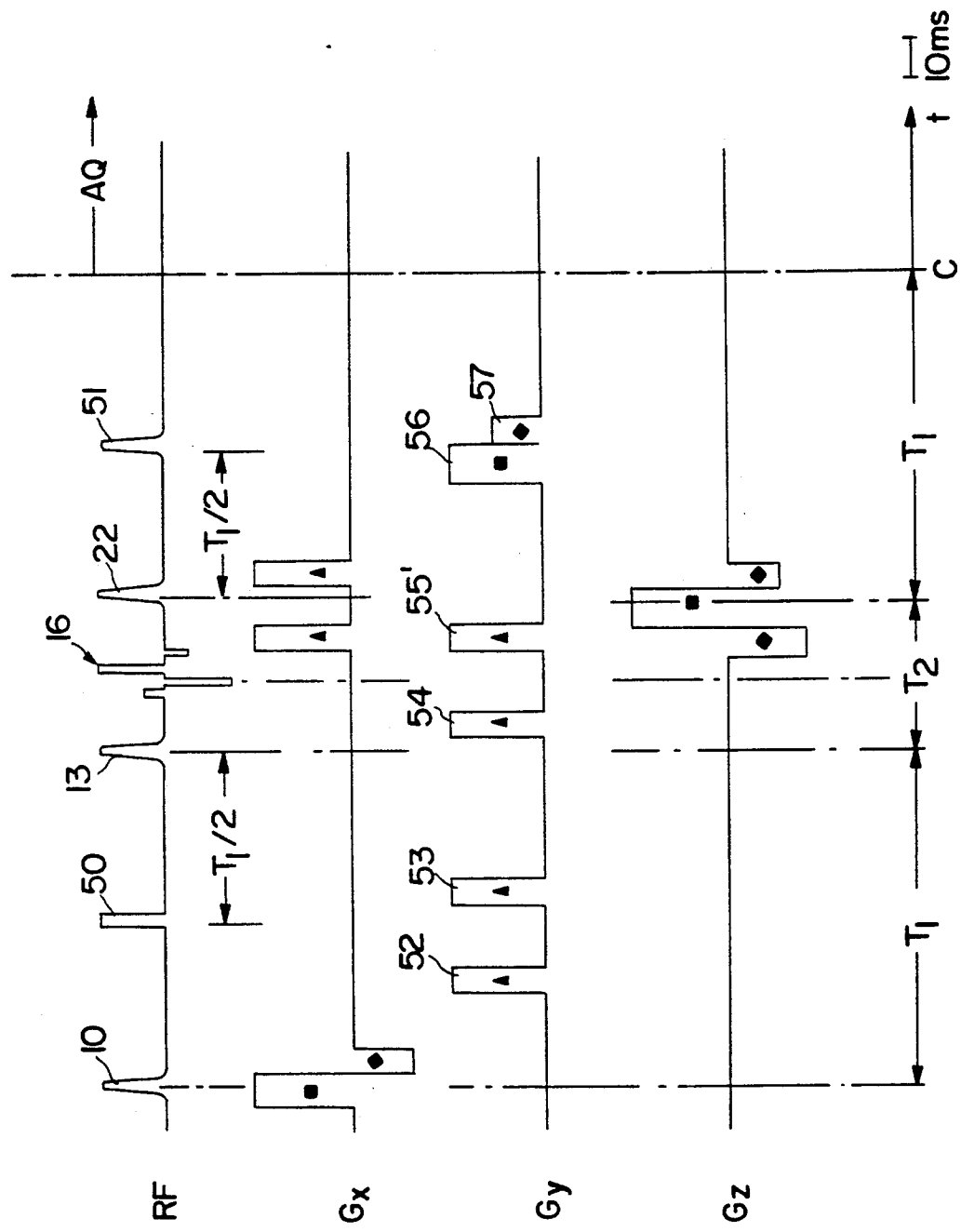

METHOD FOR RECORDING SPIN RESONANCE SPECTRA

The present invention relates to a method for recording nuclear resonance spectra of test samples having at least three groups of nuclei of the same kind, the first group being coupled to a second group, while a third group is uncoupled relative to the second group but has a chemical shift which is substantially identical only to that of the first group, the method comprising the step of suppressing the signal of the third group for the purpose of obtaining an isolated image of the signal of the first group.

Further, the invention relates to a method for recording nuclear resonance spectra of test samples having at least three groups of nuclei, a first group of the first kind of nuclei being coupled to a second group of a second kind of nuclei, while a third group of the first kind of nuclei is uncoupled relative to the second group, but has a chemical shift which is substantially identical only to that of the first group, the method comprising the step of suppressing the signal of the third group for the purpose of obtaining an isolated image of the signal of the first group.

Finally, the method relates generally to a method for recording spin resonance spectra of test samples having at least three groups of spins, the first group of them being coupled to a second group, while a third group is uncoupled relative to the second group but provides a signal having a spectral position substantially identical only to that of the first group, the method comprising the step of suppressing the signal of the third group for the purpose of obtaining an isolated image of the signal of the first group.

It has been known in practice in the field of spin resonance spectroscopy to "edit" spectra where signals of different groups of nuclei heterodyne one with the other. By "editing" one understands different recording techniques which allow to filter out individual signals from the heterodyning spectra. Usually, this is effected by carrying out series of several measurements using different measuring parameters, and eliminating thereafter the undesirable signal contents by substraction.

Examples of such editing techniques for nuclear magnetic resonance applications have been described in the textbook entitled "Modern NMR Spectroscopy" by Sanders, Jeremy K.M. and Brian K. Hunter, Oxford University Press, 1987, pages 237 to 259. Other methods of this type are described by EP-OS 244 752 and EP-OS 166 559. In the case of these other known methods, uncoupled spins are suppressed by forming the difference between two measurements.

However, all of the techniques described above have the common disadvantage that for recording a single spectrum a plurality of measurements have to be performed successively in time, using different measuring parameters. While this presents no substantial problem to a laboratory in the case of durable chemical samples, considerable problems can result in cases where such nuclear magnetic resonance spectra are to be recorded on biological samples, i.e. on living tissue. This is true above all for in-vivo measurements to be carried out on patients where movement artefacts may lead to adulterations of the measured values.

In addition, substracting measuring methods are connected with the fundamental drawback that the subtraction of high noise signal amplitudes may give rise to measuring errors which may be in the same range of magnitude as the useful signal.

According to other known methods, nuclear magnetic resonance spectra are recorded in a volume-selective way, i.e. only for a limited, geometrically defined area of a sample. This recording technique has gained particular importance in the fields of biological research and medicine. For, this recording technique enables, for example, a nuclear magnetic resonance spectrum to be recorded for a given, defined point in an inner organ of a patient.

The technique of recording volume-selective nuclear magnetic resonance spectra has been known as such. Examples of this technique are found in the textbook entitled "Biomedical Magnetic Resonance Imaging" by Wehrli, Felix W., Derek Shaw and J. Bruce Kneeland, Verlag Chemie, 1988, pages 1 to 45 and 521 to 545.

Other known methods are, for example, the so-called SPARS method, which has been described by the US publication "Journal of Magnetic Resonance", 67 (1986), page 148, and the so-called DIGGER method, described by the US publication "Journal of Magnetic Resonance", 68 (1986), page 367. These known methods are volume-selective methods where the layers outside the selective volume area are saturated so that only the selected volume area is left. However, it is a disadvantage of these two known methods, in particular of the DIGGER method, that they require high r.f. power and that the pre-saturation r.f. pulses must be tuned very exactly in both methods as otherwise additional signals may be generated.

Another special method for volume-selective imaging of nuclear magnetic resonance spectra using three 90° r.f. pulses spaced in time, while applying simultaneously different magnetic gradient field pulses in different coordinate directions, has been described for example by DE-OS 34 45 689. In the case of this known method, conventional stimulated spin echoes are produced.

Other similar methods have been known from U.S. Pat. No. 4 680 546, U.S. Pat. No. 4 703 270 and US publication "Journal of Magnetic Resonance", vol. 78, pages 205 to 212; vol. 81, pages 333 to 338; vol. 60, pages 337 to 341, and vol. 78, pages 355 to 361.

Finally, it has been known from the US publication "Magnetic Resonance in Medicine", 9 (1989), pages 254 to 260, to edit volume-selective spectra by means of homonuclear polarization transfer, using a single transfer.

Now, when the nuclear magnetic resonance spectrum of a homonuclear or heteronuclear coupled spin system of the general form $A_n X_m$ is to be recorded—this is of great interest in biomedical research as such measurements permit to draw conclusions regarding the metabolism in organic tissue—one frequently encounters the problem of over-lapping signals. In the case of a homonuclear coupled spin system, both coupling partners consist of one and the same kind of nuclei, for example of protons ($^1H$), while in the case of heteronuclear coupled spin systems the coupling partners belong to different kinds of nuclei, for example the A group may be protons ($^1H$) while the X group may be a carbon isotope ($^{13}C$). If one regards lactate, a $A_3 X$ system, as a homonuclear example, the methyl group ($CH_3$), has substantially the same chemical shift, i.e. line position in the spectrum, as the $CH_2$ group of lipid, both chemical shifts being in the range of 1.35 ppm. Given the fact, however, that the lipid concentration may be considerably higher in living tissue, the CH$_2$ signal of the lipid will mask the CH$_3$ signal of the lactate. The same applies by analogy to any editing of heteronuclear A$_n$X$_m$ systems, for example to an A$_3$X system such as methanol with a $^{13}$C enrichment.

Now, if in the case of the first-mentioned example a volume-selective lactate measurement were carried out in a lipid environment, using the known editing techniques where, as has been mentioned before, two measurements have to be performed successively in time using different parameters, problems would be encountered if the patient should move during the two measurements. For, any such movement would give rise to artefacts, which would influence the measurements differently so that it would be necessary, during the subsequent subtracting process, to work out, by suitable editing, not only the desired isolated CH$_3$ signals of the lactate, but also the undesirable lipid artefacts.

Although the invention will be explained for the purposes of the present invention by way of an application chosen from the nuclear magnetic resonance (NMR) field, it is understood that it can be applied also in connection with other forms of spin resonance, in particular electron paramagnetic resonance (EPR) or nuclear/electron double resonance techniques (ENDOR, ELDOR, NEDOR, Overhauser, etc.).

Further, although the invention will be described using the simple example of scalar coupling (J) it is understood that it is suited also for application in connection with other coupling types, for example, dipole coupling.

Now, the present invention has for its object to improve a method of the before-mentioned type in such a way as to enable volume-selective measurements to be carried out on biological samples, in particular on patients, using a single pulse sequence.

The invention achieves this object, in the case of the first-mentioned method for recording nuclear resonance spectra on homonuclear systems, by a process wherein a pulse sequence of three r.f. pulses, preferably 90° r.f. pulses, are irradiated upon the sample, the second r.f. pulse is applied in such a way that the magnetization of the nuclei of the first group is transferred to the nuclei of the second group by polarization transfer, a first magnetic gradient field pulse, with dephasing effect for the nuclei of the second group, is exerted upon the sample in the time interval between the second r.f. pulse and the third r.f. pulse, the third r.f. pulse is adjusted in such a way that the magnetization of the nuclei of the second group is retransferred to the nuclei of the first group by polarization re-transfer; and thereafter a second magnetic gradient field pulse, being rephasing for the nuclei of the first group, is exerted upon the sample.

In the case of the second before-mentioned method for recording nuclear resonance spectra on heteronuclear systems, the object underlying the invention is achieved on the one hand by a process wherein a pulse sequence of five r.f. pulses, preferably 90° r.f. pulses, are irradiated upon the sample, the second r.f. pulse and a third r.f. pulse are adjusted in such a way that the magnetization of the nuclei of the first group belonging to the first kind of nuclei is transferred by polarization transfer to the nuclei of the second group belonging to the second kind of nuclei, at least one first magnetic gradient field pulse, with dephasing effect for the nuclei of the second group, is exerted upon the sample in the time interval between the third r.f. pulse and the fourth r.f. pulse, a fourth r.f. pulse and a fifth r.f. pulse are adjusted in such a way that the magnetization of the nuclei of the second group is retransferred to the nuclei of the first group by polarization re-transfer; and thereafter a second magnetic gradient field pulse, being rephasing for the nuclei of the first group, is exerted upon the sample.

Further, with respect to the general spin resonance case, the object underlying the invention can be achieved by a process wherein a pulse sequence of at least three r.f. pulses, preferably 90° r.f. pulses, are irradiated upon the sample, at least the second r.f. pulse is applied in such a way that the magnetization of the spins of the first group is transferred to the spins of the second group by polarization transfer, at least one first magnetic gradient field pulse, with dephasing effect for the spins of the second group, is exerted upon the sample following the second r.f. pulse, at least another one of the r.f. pulses is adjusted in such a way that the magnetization of the spins of the second group is retransferred to the spins of the first group by polarization re-transfer; and finally a second magnetic gradient field pulse, being rephasing for the spins of the first group, is exerted upon the sample.

These measures solve the object underlying the invention fully and perfectly. For, the invention makes use of an artifice insofar as the magnetization of the first group of nuclei of interest is transferred by polarization transfer, for a specific time interval, to another group of nuclei, i.e. the second group, whose line in the spectrum is that of a different chemical shift, or belongs to a different kind of nuclei. The signal of the nuclei of the first group is coded by defined dephasing of the magnetization of those nuclei, and is then retransferred from the second group to the first group by polarization re-transfer, and rephased in the same defined way, i.e. decoded, while the disturbing signal of the third group, which had remained in the previous spectral range, is suppressed during that same period of time. To say it in other words: The information of interest, namely the magnetization of the nuclei of the first group, is shifted for a short period of time to a range of different chemical shift, namely that of the second group, and is coded by dephasing, in order for the information of interest to be brought back to its original range of chemical shift, while thereafter the group of interest, namely the first group, is rephased (decoded) whereby the signals of the third group, which is of no interest in the experiment, are extinguished. This is possible because only nuclei of interest, i.e. the first group, are coupled to the second group and because only the signals of that group are not extinguished.

The use of magnetic gradient field pulses provides the advantage, on the one hand, that the so-called "spoil gradients" dephase the magnetization of the second group of nuclei after application of the second r.f. pulse so that all phases will be distributed evenly in the xy plane. Consequently, their generally arbitrary phase, which has been predetermined by the first two 90° r.f.

pulses, is of no influence relative to the third 90° r.f. pulse, which really renders possible the disk selection in z direction. The influence of the before-mentioned dephasing of the magnetization of the second group of nuclei is then reversed by the second rephasing magnetic gradient field pulse (action on the nuclei of the third group), which is introduced after the third 90° r.f. pulse.

In consequence this means that the desired edited signal can be obtained already by a single pass so that any movement artefacts, for example, cannot make themselves felt in a disturbing manner. On the other hand, it is of course also possible to record several cycles in series in order to obtain, in the usual manner, an increase in signal-to-noise ratio, or to average out phase errors by the application of known techniques using cyclical phase shifting. But this has nothing to do with the fact that, basically, the entire edited spectrum is recorded already with the aid of a single pulse sequence. Since, as has been mentioned before, the method according to the invention makes use of the different relationships of the first and third groups of nuclei to the second group, with respect to chemical shift and coupling, the disturbing signals of the third group are also completely suppressed.

In contrast to the methods known, for example, from DE-OS 34 45 689, coherence-transfer spin echoes are generated in the case of the present invention, instead of the conventional stimulated spin echoes.

According to a preferred embodiment of the method according to the invention, for volume-selective imaging, the sample is exposed in a conventional manner to a sequence of magnetic gradient field pulses of different coordinate directions, and at least three of the r.f. pulses are adjusted in a disc-selective manner.

These features provide the advantage that selective measurements can be performed on defined, almost point-shaped areas inside a sample, for example inside a living human body. It is thus possible to perform aimed measurements on inner organs of patients.

According to another preferred embodiment of the method according to the invention, another r.f. pulse, being selective for the nuclei of the second group with respect to the chemical shift, preferably a 180° r.f. pulse, is irradiated after the r.f. pulse effecting the polarization transfer.

These features are of particular advantage in the presence of a fourth group of nuclei which is coupled to the third group so that normally the disturbing magnetization of the third group will also be transferred, as a result of the second r.f. pulse, by polarization transfer, namely to the fourth group of nuclei now present. If, however, the selective additional r.f. pulse is irradiated-acting only on the nuclei of the second group, due to its selectivity-then the magnetization of the second group will dephase relative to that of the fourth group in a different manner so that it will not be retransferred to that of the third group by polarization transfer. This finally means that although the disturbing magnetization of the third group encountered with samples having a fourth group of nuclei of the described type is initially transferred to that fourth group by polarization transfer, it will not be retransferred to the range of the first group by the polarization retransfer process so that the strong heterodyned signal of the third group will be extinguished also for such samples.

According to another preferred embodiment of the method according to the invention, using homonuclear coupled systems, the method is carried out on lactate samples.

This application is one of particular importance in biomedicine.

A preferred improvement of the before-described method according to the invention provides that prior to irradiating the first 90° r.f. pulse, one exposes the sample to a r.f. pre-saturating pulse selective for the nuclei of the second group, and thereafter to a magnetic gradient field pulse that is dephasing for those nuclei.

This feature provides the advantage to suppress disturbing signals, for example those of water, which are found in the immediate neighborhood of the second group, with respect to the chemical shift. These measures have no influence on the subsequent polarization transfer and polarization retransfer, suppressing only coherences which anyway are not observable.

According to another preferred embodiment of the method according to the invention, the first and the second magnetic gradient field pulse are positioned at the time axis, relative to the r.f. pulses, in such a way that no stimulated echoes of uncoupled spins are generated.

This measure provides the advantage that any stimulated echo, resulting from undesirable uncoupled spins that might be refocused through the second and third 90° r.f. pulses, are dephased again as such undesirable refocusing would be encountered only for a symmetrical area, i.e. the product of intensity and length of the magnetic gradient field pulses relative to the r.f. pulses.

Generally, it can be said that other advantages result from the method according to the invention, such as the phase-independence of all pulses which results from to the fact that the magnetization can be dephased by magnetic gradient field pulses before every second and third 90° r.f. pulse. Further, the value of the r.f. field strength of the r.f. pulses has no notable effect on the measuring result, but may at the most lead to a certain signal loss so that the method according to the invention can be used also with surface coils. Finally, the length of the time interval selected between the first and the second 90° r.f. pulses and between the third 90° r.f. pulse and the beginning of the spectrum-recording step is also uncritical because any deviation from the theoretical value of $1/(2J)$ for the $A_nX$-system, or $1/(4J)$ for the $A_nX_2$-system would lead to a certain signal loss only if the transversal relaxation times $T_2$ are much longer than the pulse sequence. For shorter relaxation times $T_2$, however, shorter time intervals may be preferable.

Finally, it is understood that other advantages may be achieved by combining the method according to the invention with other, conventional measures including, for example, recording of the complete echo in time-symmetry around the point located at the time interval $\tau_1$ after the third 90° r.f. pulse.

Further, it is possible, by varying the magnetic gradient field pulses and by superimposing a read gradient upon the echo, with subsequent Fourier transformation, to generate an image of a two-dimensional or three-dimensional area. The method according to the invention is also suited for being integrated into known imaging methods, for example the 2D-FT method with phase and read gradient, or the back-projection method using read gradients under variable angles, or else the chemical-shift imaging method, i.e. high-resolution spectroscopy using two phase gradients (without a read gradient).

According to a further preferred variant of the before-described method according to the invention, a 180° r.f. pulse is irradiated upon the sample in the middle of the time interval between the first and the second r.f. pulses and following the third r.f. pulse.

This feature provides the advantage to double the signal intensity.

Other advantages of the invention will appear from the specification and the attached drawing.

It is understood that the features that have been described before and will be explained hereafter may be used not only in the described combinations, but also in any other combination, or individually, without leaving the scope and intent of the present invention.

One embodiment of the invention will now be described in more detail with reference to the drawing in which:

FIG. 1 shows a very diagrammatic representation of a nuclear resonance spectrum of a homonuclear coupled $A_3X$ system, namely that of lactate ($CH_3$—CH(OH)—COOR);

FIG. 2 shows a pulse program illustrating one embodiment of the method according to the invention applied to a homonuclear coupled system;

FIG. 3 shows a representation of a first test sample, for verifying the properties of the embodiment of the method according to the invention;

FIGS. 4–6 show nuclear resonance spectra recorded on a sample according to FIG. 3;

FIG. 11 shows a representation similar to that of FIG. 2, but for a variant of the pulse program illustrated in that figure, with two additional 180° pulses;

Figure 10:
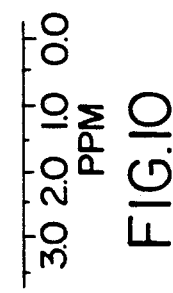
FIGS. 8–10 show three spectra similar to those of FIGS. 4 to 6.

FIG. 1 shows, in a very diagrammatic way, a nuclear resonance spectrum of lactate, a system with J coupling between the protons of the $CH_3$ group (A line at 1.35 ppm) and the proton of the CH group (X line at 4.1 ppm). The A line of the $CH_3$ group of the lactate is masked by the much more intensive B line of the $CH_2$ group of the surrounding lipid because the lipid concentration of biological samples is often much higher.

Now, it is intended to work out from the heterodyned spectrum the A line by suitable editing. This is achieved with the pulse program illustrated in FIG. 2. The pulse program serves for performing a volume-selective measurement, it being understood, however, that the method according to the invention is not limited to volume-selective measurements.

The upper line of the pulse program of FIG. 2 shows r.f. pulses, this term being used in nuclear resonance technique to describe pulsed r.f. signals of a defined envelope contour. One distinguishes between so-called "soft pulses", i.e. pulses of relatively long duration and relatively low amplitude, and so-called "hard pulses", i.e. such of relatively short duration and high amplitude. In addition, one distinguishes between selective and non-selective pulses, depending on whether the envelope curve of the pulses results in a narrow or a wide frequency spectrum.

On the three middle lines of the pulse diagram of FIG. 2, magnetic gradient field pulses $G_x$, $G_y$ and $G_z$ have been plotted for the three coordinate directions x, y and z. The pulses marked in FIG. 2 by the symbol "■" are so-called "disk gradients", i.e. gradient pulses serving to select a disk in space, while the pulses marked by the symbol "♦" are so-called "trim gradients", i.e. gradients preceding or following the disk gradients and serving to focus the magnetization. The pulses marked by the symbol "▲" finally represent so-called "spoil gradients" with the aid of which it is possible to dephase or rephase specific magnetizations in a given coordinate direction and to extinguish or restore thereby their magnetization, as a signal.

It is understood that the magnetic gradient field pulses may be velocity- and acceleration-compensated in the manner known as such, for example from U.S. publication "Journal of Magnetic Resonance", 77 (1988), page 596.

It is now possible, in the case of the method according to the invention to proceed in the conventional manner, i.e. to apply initially, before the beginning of the pulse sequence according to FIG. 2, a so-called r.f. pre-saturation pulse or a corresponding dephasing gradient, or both, in order to extinguish the magnetization of the X group and of possible other disturbing signals, for example those of water, so that they can be neglected during the further process.

However, the inventive method proper commences with the first r.f. pulse, preferably a 90° r.f. pulse 10 which is irradiated upon the sample in the x direction during the action of the first disk gradient 11, followed by a trim gradient 12.

The first 90° r.f. pulse 10, just as the other 90° r.f. pulses which will be described further below, is a so-called soft pulse having, for example, an envelope curve sinx/x and a disk-selective effect in the x, y or z direction in the presence of a magnetic field gradient. The first 90° r.f. pulse 10, just as the other 90° r.f. pulses which will be described further below, has no selective effect as regards the chemical shift.

The pulse angles of the 90° r.f. pulses are relatively uncritical, except that the pulse angle must be greater than 0°. For example, the first "90°" r.f. pulse may be set as a so-called "ERNST" angle which is smaller than 90°. This angle permits a rapid image sequence in imaging processes.

Further, the first 90° r.f. pulse 10 can be replaced by a pulse sequence advanced in time and consisting of a 90° r.f. pulse and a 180° r.f. pulse selective for the A magnetization, in order to suppress any disturbing signals, for example those of water, even more efficiently.

Due to the first 90° r.f. pulse 10, the entire magnetization of the A and X nuclei shifts to the x-y plane, although this naturally can be true for the X magnetization only on the condition that it had not been extinguished before in the manner just described.

The magnetization of the A group, i.e. for example that of the methyl group of lactate ($A_3X$ system) now evolves during the following time interval $\tau_1$ under the influence of the J coupling effect, the general relationship for an $A_nX$ system, in response to the transversal relaxation time $T_2$, being:

$$\tau 1 = \frac{1}{\pi J} \text{ arc cot}\left(\frac{1}{\pi J T_2}\right)$$

Thus, the following applies to this term: $\tau_1 \leq 1/(2J)$ or an odd multiple thereof.

Correspondingly, the following formula applies for an $A_nX_2$ system:

$$\tau 1 = \frac{1}{2\pi J} \text{ arc cot}\left(\frac{1}{2\pi J T_2}\right)$$

Now, an antiphase magnetization evolves. In the case of lactate, J is for example equal to 7.35 Hz, so that the time interval $\tau_1$ is set to 68 ms.

At the end of the time $\tau_1$, a second 90° r.f. pulse 13 is irradiated upon the sample, while at the same time a disk gradient 14 and/or a trim gradient 15 is exerted on the sample in the y direction.

The second 90° r.f. pulse 13 has the effect that the antiphase magnetization of the A group, and only this, is transferred to the X spins by polarization transfer, this being possible due to the J coupling between the A group and the X group (CH) at a given chemical shift, while the B magnetization cannot be transferred, for lack of corresponding coupling. However, in the presence of a fourth group Y, coupled only to the B group, the (disturbing) B magnetization is transferred to the Y group by polarization transfer when the A magnetization is transferred to the X group.

Now, the X spins are also in antiphase relative to each other.

By the second 90° r.f. pulse 13, the magnetization of the A group—to say it in more general terms—is transferred approximately ½ by polarization transfer, ¼ by double quantum transfer and ¼ by zero quantum transfer (in the case of experiments with heteronuclear coupled spin systems, by multiple-quantum transfer). In the context of the invention that will be described in the following application, we will observe only that content which is transferred by polarization transfer. The portion of ¼ which is transferred by way of double-quantum or multiple-quantum transfer will be discussed in a parallel application of the same day filed by the same applicant (Counsel's file number: 1213P101). The disclosure content of that application is incorporated by reference in the present application.

Now, only the antiphase X magnetization is projected, preferably through an 180° r.f. pulse 16, to a point symmetrical in time to the second 90° r.f. pulse 13, and located at a time interval $\tau_2$ relative to that second 90° r.f. pulse 13. In the case of the 180° r.f. pulse it is again not necessary to adhere exactly to the angle of 180°.

The 180° r.f. pulse 16 is selective for the X group, i.e. selective with respect to its chemical shift. In the presence of a fourth group Y it does not, therefore, act on the B magnetization that has been transferred to it by polarization transfer.

The 180° r.f. pulse 16 acts to reverse the influence of the J modulation on the magnetization of the X group.

During that time, the sample is exposed to a spoil gradient 17 in the x direction, further to trim and disk gradients 14, 15, 18, in the y direction and to a sequence of trim and disk gradients 19, 20, in the z direction. The spoil gradient 17 effects defined dephasing, i.e. coding of the X magnetization.

A third 90° r.f. pulse 22, effecting the repolarization of the X magnetization to the A group, is then irradiated upon the sample at a time interval $\tau_2$ to the second 90° r.f. pulse 13, i.e. in symmetry to the 180° r.f. pulse 16 preferably exerted at a time interval $\tau_2$ to the second 90° r.f. pulse 13. The time interval $\tau_2$ between the second r.f. pulse 13 and the third r.f. pulse 22 is adjusted as short as possible for this purpose.

During the following $\tau_1$ interval, the retransferred magnetization now evolves to an in-phase magnetization which after the moment C, where an echo maximum is encountered, can be recorded and imaged, during a recording interval AQ, as free induction decay (FID) using known Fourier processing methods. Preferably, only the "right" side of the echo is recorded, i.e. beginning at the moment C.

In addition, there is applied on the sample, symmetrically to the third 90° r.f. pulse 22, a further spoil gradient 23 in the x direction, symmetrically to the spoil gradient 17, a trim gradient 24 in the y direction and a trim gradient 21 in the z direction.

This has the effect that the X magnetization is dephased in a defined manner, i.e. decoded, by the spoil gradient 17, whereafter its arbitrary phase as determined by the r.f. pulses 13 and 16 is without any influence with respect to the third 90° r.f. pulse, and disk selection is possible in the z direction.

Upon completion of the polarization retransfer by the third 90° r.f. pulse 22, and rephasing of the A magnetization by the second spoil gradient 23, there exists only a measurable magnetization of the A group at this point of the spectrum, which can then be evaluated in the known manner, while any stimulated echoes that may still be encountered are suppressed by the second spoil gradient 23.

For, as can be seen in FIG. 2, the gradient pulses act asymmetrically to the 90° pulses 13 and 22, so that no undesirable refocusing of other uncoupled spins can occur, this being prevented by the asymmetrical arrangement of the gradient pulses in the two $\tau_1$ intervals.

FIG. 2 further shows that the influence of the chemical shift and of magnetic field inhomogeneities on the A magnetization, during the duration of the first $\tau_1$ interval, can be reversed during the second $\tau_1$ interval by the two 90° pulses 13 and 22, which can be imagined as being a single 180° pulse.

With respect to the X magnetization, this is effected by analogy (including the J modulation), during the interval $\tau_2$, by the 180° pulse 16 which is selective for this group.

The function and effect of the pulse program illustrated in FIG. 2 was verified experimentally by the following tests, among others:

FIG. 3 shows diagrammatically a sample 30, with a ball 31 having a volume of approx. 1 cc and containing a mixture of 50% of pure acetate and 50% of pure lactate in a water environment 32.

FIG. 4 shows in this connection a spectrum recorded by a prior-art method where a disturbing acetate line can be seen at approx. 2.0 ppm beside the lactate line at appox. 1.35 ppm. The measurement was effected using a pulse sequence similar to that described in U.S. publication "Journal of Magnetic Resonance", 72, 1987, on page 379. The magnetic field strength employed was 4.7 T.

In contrast, FIG. 5 represents a measurement taken with the aid of the method according to the invention using a pulse program according to FIG. 2, with otherwise unchanged experimental conditions, except that a scaling factor of 2 was used for signal imaging. FIG. 5 shows very clearly that, given due regard to this scaling factor, the $CH_3$ signal at 1.35 ppm is approximately as high as in the spectrum of FIG. 4, while the uncoupled spins of the acetate have practically disappeared.

FIG. 6 shows a check measurement which was intended to verify the volume selectivity of the method according to the invention.

The three-dimensional set-up of the sample used for the measurement of FIG. 6 was identical to that illustrated in FIG. 3, but the ball 31 consisted of pure acetate, while the surrounding 32 consisted of pure lactic acid.

It can be clearly seen in FIG. 6 that the measurement is in fact selective, because only the volume area of the ball 31 was measured, the uncoupled spins of the acetate being suppressed by the method according to the invention, whereas no $CH_3$ signal of the lactate was recorded since no lactic acid is present at the place—and only at the place—of the ball 31.

Figure 7:
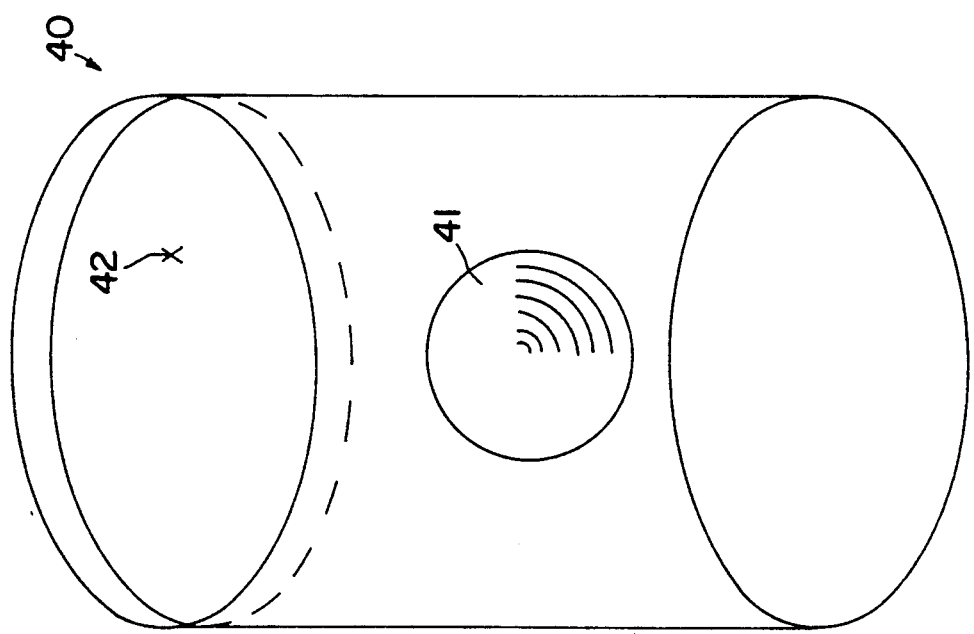
FIG. 7 shows a representation similar to that of FIG. 3, but for a different test sample.

Another test series was carried out using a sample according to FIG. 7, with a ball 41 in an environment 42. Having a volume of 27 cc, the ball 41 was substantially bigger than the ball 31 of the sample 30 according to FIG. 3.

The ball 41 consisted initially of an emulsion of 5% olive oil (with coupled and uncoupled lipids) and 10 mMol of lactate.

Figure 8:
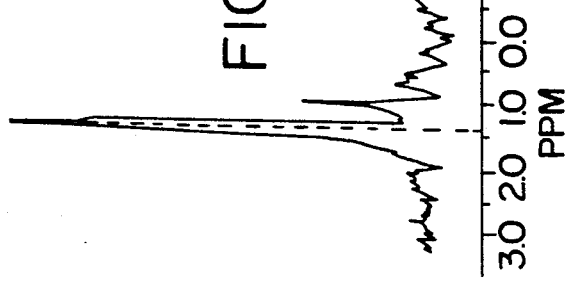

FIG. 8 shows a spectrum which was recorded by a single measurement taken in a conventional manner in a total-body tomograph, using a pulse sequence identical to that used for the spectrum of FIG. 4. One distinguishes very clearly the strong lipid signal ($CH_2$ group) at approx. 1.4 ppm, which masks the lactate signal. At approx. 0.9 ppm, the coupling partner belonging to the $CH_2$ group, namely the $CH_3$ group, can be seen.

Figure 9:
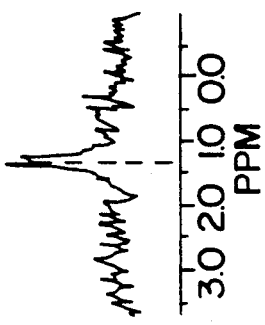

In contrast, FIG. 9 shows again a spectrum recorded with the aid of the method according to the invention, using 16 accumulation measurements, and it can be noted that only the desired lactate signal remains, while the strong lipid signal has been suppressed. This is proved by the check measurement illustrated in FIG. 10, where the ball 41 was filled only with a 5% olive oil emulsion so that no signal was recorded.

FIG. 11 shows a variant of the pulse program of FIG. 2. In the case of the variant illustrated in FIG. 11, a 180° r.f. pulse 50 or 51 is inserted at the middle of the interval between each first 90° r.f. pulse and each second 90° r.f. pulse 13, and following the third 90° r.f. pulse 22. The time interval between the 180° r.f. pulse is 50 and 51 on the one hand, and their preceding 90° r.f. pulses 10 and 22, on the other hand is, therefore, equal to $\tau_1/2$.

As regards the magnetic gradient field pulses, only the $G_y$ gradients are varied; one recognizes in FIG. 11 four spoil gradients 52, 53, 54, 55, which are irradiated symmetrically to the first 180° r.f. pulse 50, and/or symmetrically to the 180° r.f. pulse 16. The y disk gradient, now disk gradient 56, now coincides in time with the second disk-selective 180° r.f. pulse 51, and is again followed by a trim gradient 57.

The pulse program illustrated in FIG. 11 permits the signal intensity to be doubled relative to that of FIG. 2.

The before-described method for measuring nuclear spin resonance spectra on homonuclear coupled spin systems, using cyclic polarization transfer (CYCLPOT) are based on the following theory:

The reduced equilibrium density operator in an $A_nX$ system is defined as follows by high-temperature approximation:

$$\delta(0_-) = \sum_{k=1}^{n+1} I_{kz}$$

wherein $I_1, I_2 \ldots, I_n$ belong to the A group, in the case of the $A_3$ system (lactate), this is for example the $CH_3$ group and $I_{n+1}$ corresponds to the X group, for example the CH group in the case of the $A_3X$ system (lactate).

After application of the first 90° r.f. pulse 10 (x phase), the equilibrium density operator is defined by the following formula:

$$\delta = \sum_{k=1}^{n+1} I_{ky}$$

Following the first evolution interval $\tau_1 = 1/(2J)$, the following relationship is obtained, including the dephasing gradients which impress upon the spins a phase $\Phi$ depending on positioning (it be assumed that this phase is very much more important than the chemical shift so that this can be neglected):

$$\delta = \sum_{k=1}^{n} [2 I_{kx} I_{(n+1)z} \cos \Phi_1 + 2 I_{ky} I_{(n+1)z} \sin \Phi_1]$$

If any more complex additional terms should arise, these can be neglected because they are practically unobservable, or will practically not occur at all due to additional pre-saturation of the X group (for example water).

The second 90° r.f. pulse 13, which may have an y phase, but may also have any other phase, effects the polarization transfer, i.e. the transfer of the A magnetization to the X magnetization:

$$\delta = \sum_{k=1}^{n} [-2 I_{kz} I_{(n+1)x} \cos \Phi_1 + 2 I_{ky} I_{(n+1)x} \sin \Phi_1]$$

The first term corresponds to an X antiphase magnetization. The second term of this equation, which corresponds to multiple-quantum coherences, is removed by the following spoil gradients, and may therefore be left out of regard on the following considerations.

The selective 180° r.f. pulse 16, selective with respect to the chemical shift, acts to refocus only the spins of the X group, i.e. $I_{(n+1)x}$, so that the condition prevailing following the second 90° r.f. pulse 13 is projected upon the condition as it exists shortly before the third 90° r.f. pulse 22. This third 90° r.f. pulse 22 (y phase) now effects a polarization retransfer of the X magnetization to the A magnetization:

$$\delta = \sum_{k=1}^{n} [2 I_{kx} I_{(n+1)z} \cos \Phi_1 \cos \Phi_2 + 2 I_{kx} I_{(n+1)x} \cos \Phi_1 \sin \Phi_2]$$

wherein $\Phi_2$ allows for the dephasing in the $\tau_2$ interval that is not refocused by the 180° r.f. pulse 16. The second term corresponds to multiple quantum coherences which lead to unobservable signals and which, therefore, can be disregarded.

During the last $\tau_1$ interval ($\tau_1$ being equal to $1/(2J)$), the A antiphase magnetization is transferred to an in-phase magnetization. At the same time, the dephasings effected during the preceding intervals are reversed:

$$\delta = \sum_{k=1}^{n} \begin{array}{l} I_{ky} \{\cos^2 \Phi_1 \cos^2 \Phi_2 + \sin \Phi_1 \cos \Phi_1 \sin \Phi_1 \cos \Phi_2\} \\ -I_{kx} \{\cos^2 \Phi_1 \sin \Phi_2 \cos \Phi_2 + \sin \Phi_1 \cos \Phi_1 \cos^2 \Phi_2\} \end{array}$$

In the case of the pulse sequence of FIG. 2, the following applies:

$$<\delta> = \frac{1}{\pi^2} \int_0^\pi \int_0^\pi \ldots d\Phi_1 d\Phi_2$$

wherein $$<\delta> = \frac{1}{4} I_{ky}$$

which shows that the signal loss amounts to approx. ¼, as compared to a fictitious measurement with free induction decay (FID).

In the pulse sequence according to FIG. 11, $\Phi_1$ must be equal to 0, the phase of the second 90° r.f. pulse 13 being shifted by 90° relative to that of the first 90° r.f. pulse 10. The chemical shift and the gradients being not refocused by the 180° r.f. pulses 50 and 51, no average is taken across $\Phi_1$. It follows that:

$$<\delta> = \frac{1}{\pi} \int_0^\pi \ldots d\Phi_2; \Phi_1 = 0$$

wherein $$<\delta> = \frac{1}{2} I_{ky}$$

From that it follows that the signal loss encountered is only ½ that of a fictitious FID measurement.

The above consideration can be applied, by analogy also to spins where $I > \frac{1}{2}$.

Figure 12:
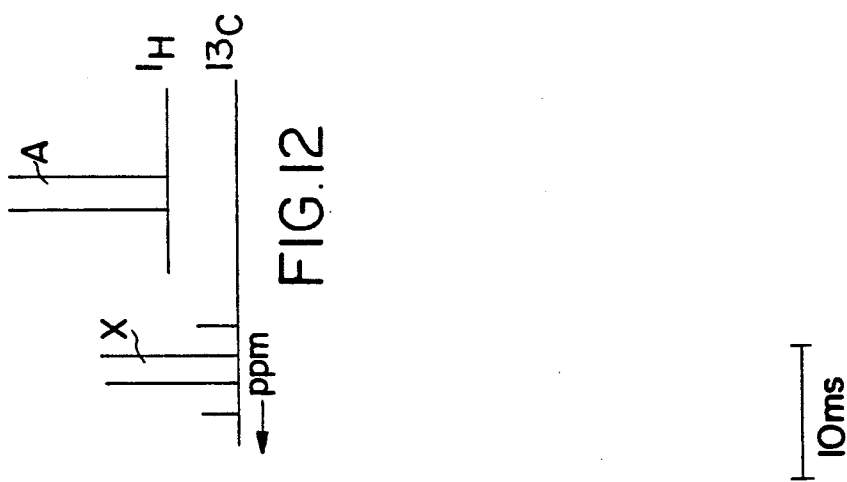
FIG. 12 shows a representation similar to that of FIG. 1, but for a heteronuclear coupled system.

FIG. 12 is a representation similar to that of FIG. 1 illustrating a heteronuclear coupled system. Such heteronuclear coupled spin systems may be, for example, spin systems of glucose, glycogen or $^{13}$C-enriched natural substances or medicines, which are of great interest in biomedical research, these systems permitting conclusions to be drawn on the metabolism in organic tissue.

In the case of the variants of the method according to the invention that have been discussed above, as applied to homonuclear coupled systems, the polarization transfer and the polarization retransfer took place within the same kind of nuclei, typically protons.

In contrast, the variants of the method according to the invention that will be discussed hereafter are applied to heteronuclear coupled systems where couplings occur between different kinds of nuclei, taking protons ($^1H$) and $^{13}C$ as examples. The excitation and signal reception on the proton side are such as to yield maximum signal intensity. However, it is necessary for this purpose to completely suppress great signal contents of uncoupled spins, such as water, fat or the main lines in the presence of natural $^{13}C$ (1%) in order to be able to detect indirectly the J-coupled $^{13}C$ satellites.

The pulse sequence described in connection with FIG. 13 enables heteronuclear coupled spin systems on the proton side to be edited, i.e. worked out, while at the same time the disturbing coupled and uncoupled signals are completely suppressed.

Figure 13:
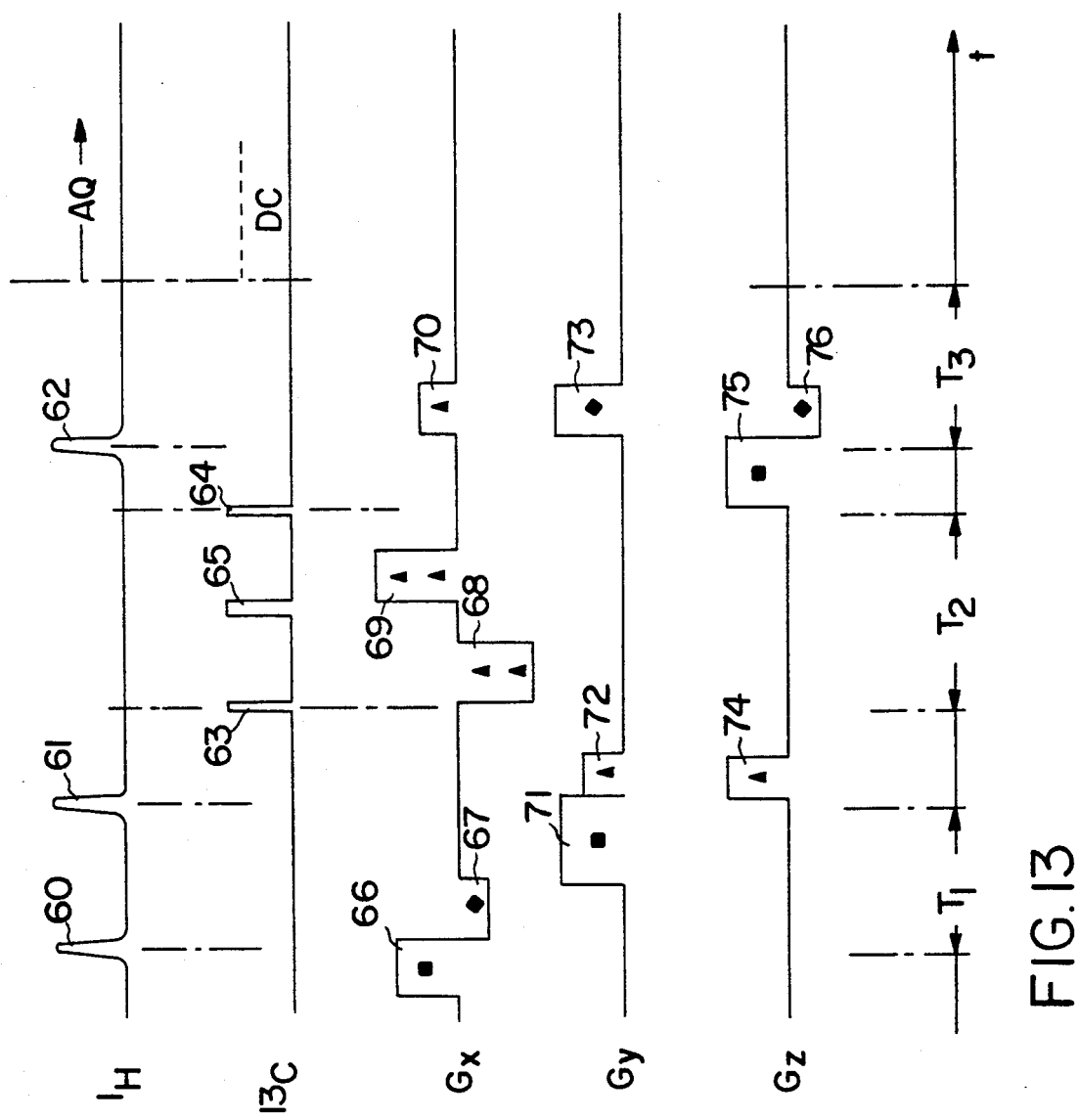
FIG. 13 shows a pulse program, illustrating an embodiment of the method according to the invention for heteronuclear coupled systems.

The representation of FIG. 13 is completely identical to that of FIGS. 2 and 11, with respect to the symbols used, except that two axes $^1H$ and $^{13}C$ for the two kinds of nuclei have been added on the radio-frequency side.

FIGS. 12 and 13 will now be discussed using the $^{13}C$-enriched test substance methanol, an $A_3X$ system, as an example, where a J coupling exists between the protons of the CH$_3$ group (A line at 3 ppm) and the $^{13}C$ nucleus (X line at 50 ppm). The heteronuclear J coupling of the biologically interesting substances is approximately equal to J=141 Hz, as in the case of methanol, which according to the before-discussed formula leads to a value of $\tau_1 = 10.7$ ms for the time interval $\tau_1$ in the case where $\tau_1 = 3/(2J)$.

As has been mentioned before, the signal, namely the A doublet, is detected in the case of this variant of the method on the proton side where the three protons present lead additionally to a higher signal intensity as compared to the $^{13}C$ side where only one nucleus is found.

FIG. 13 shows that here again three r.f. pulses, namely three 90° r.f. pulses 60, 61, 62 are irradiated on the proton side. Given the fact that our system is a heteronuclear system, "wide-band" excitation is required for both the A and the X magnetization. Consequently, a first polarization transfer is effected by the second 90° r.f. pulse 61 and a selective 90° r.f. pulse 63 irradiated on the $^{13}C$ side, while the following polarization retransfer is effected by another selective 90° r.f. pulse 64 on the $^{13}C$ side, and the third 90° r.f. pulse 62 on the proton side.

In the case of the variant illustrated in FIG. 13, a 180° r.f. pulse 65 is exerted selectively upon $^{13}C$ in the middle of the time interval between the 90° r.f. pulses 63 and 64, for refocusing the X magnetization. As has been discussed before, with reference to the homonuclear coupled spin systems, the pulse sequence according to FIG. 13 also effects dephasing of the $^{13}C$ spins in the $\tau_2$ interval and rephasing of the protons in the subsequent time interval $\tau_3$. The subsequent time interval $\tau_3$ is, usually, as long as the first time interval $\tau_1$.

The generation of stimulated echoes of uncoupled protons is prevented in both proton intervals by asymmetrical gradients.

FIG. 13 shows in x direction that initially a disk gradient 66 with subsequent trim gradient 67 is exerted upon the sample on the proton side, at the time when the first 90° r.f. pulse 60 is applied. During the $^{13}C$ interval of the duration $\tau_2$, two spoil gradients 68, 69 are exerted upon the sample in time symmetry to the 180° r.f. pulse 65, the two spoil gradients 68, 69 being heteropolar. Due to the gyromagnetic ratio of $^{13}C$, which is smaller by the factor four compared with protons, the gradients in the $\tau_2$ interval must be greater by the factor four, this being indicated by the four symbols "▲". Another spoil gradient 70 is positioned after the third 90° r.f. pulse 62 on the proton side in x direction.

In y direction, a disk gradient 71 followed by a spoil gradient 72 are introduced on the proton side at the time of the second 90° r.f. pulse 61, while a trim gradient 73 in the y direction coincides in time with the spoil gradient 70 in x direction.

In z direction, a spoil gradient 74 coincides in time with the spoil gradient 72 in y direction, while a disk gradient 75 followed by a subsequent trim gradient 76 are exerted in the z direction on the proton side at the time of the third 90° r.f. pulse 62.

Figure 14:
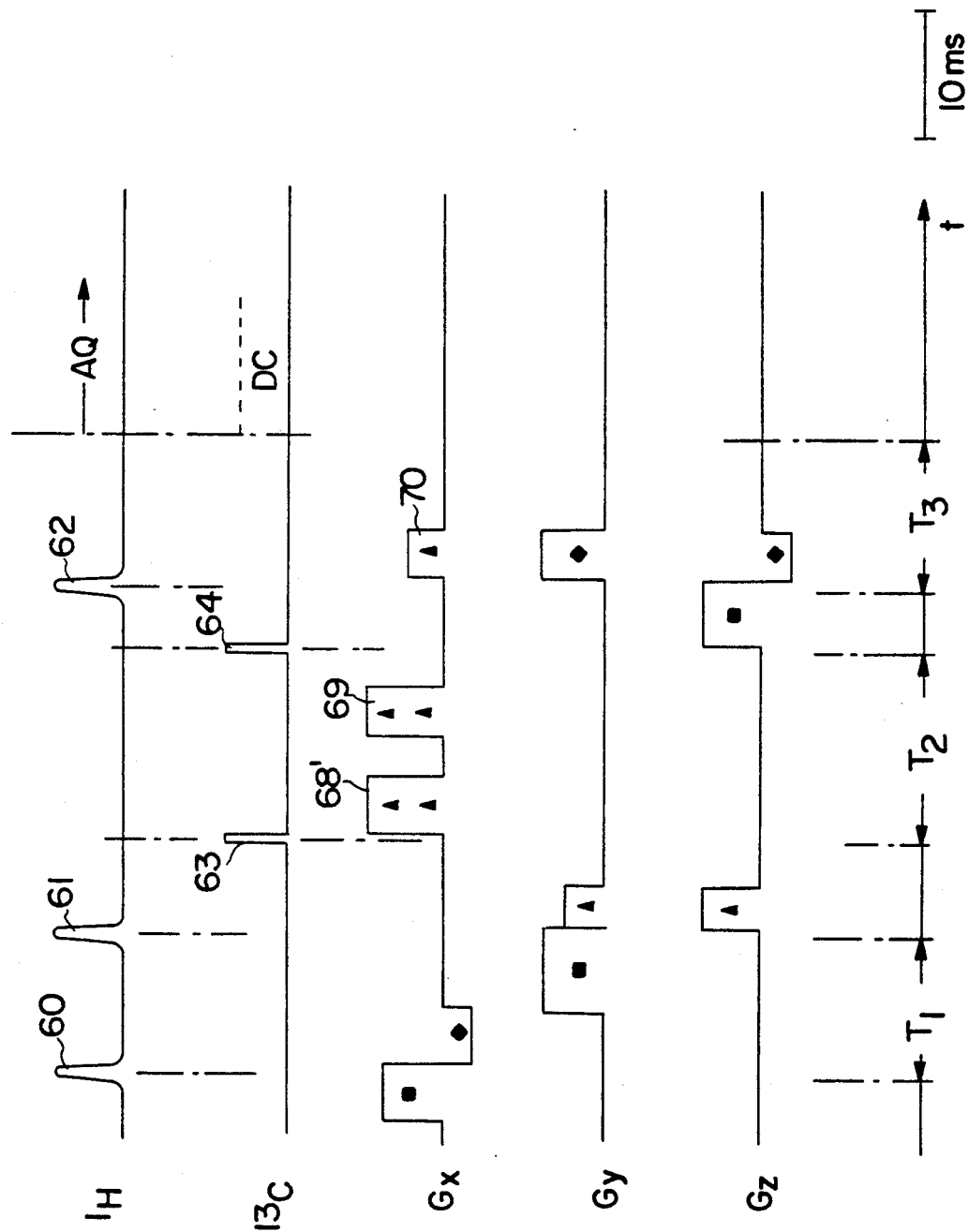
FIG. 14 shows a variant of the pulse program illustrated in FIG. 13.

The pulse sequence of FIG. 14 differs only slightly from that of FIG. 13. One will note in FIG. 14 that the 180° r.f. pulse 65 on the $^{13}$C side is missing in the $^{13}$C time interval $\tau_2$. On the other hand, the two dephasing spoil gradients 68' and 69 in the x direction are now homopolar. As the refocusing 180° r.f. pulse 65 is now missing, the interval length $\tau_2$ on the $^{13}$C side must now be set to n/J for the second 90° r.f. pulse 64 to achieve maximum X antiphase magnetization. In the present case, n=2 has been selected for reasons of time.

In principle it would be possible to apply a pulse sequence without a 180° refocusing pulse also for pulse sequences which are intended for homonuclear coupled spin systems, such as the pulse sequences of FIGS. 2 and 11. But then the middle time interval $\tau_2$ would become excessively long in such pulse sequences, and the loss in signal intensity connected therewith would get too important, due to transversal relaxation, and in addition it would no longer be possible to suppress undesirable coupled protons.

Due to magnetic field inhomogeneities, which are no longer refocused by the pulse sequence according to FIG. 14, due to the missing 180° r.f. pulse, the third time interval $\tau_3$ must be equal to $\tau_1 + \tau_2/4$ or $\tau_1 + n/(4J)$. If n=2, an antiphase magnetization with good resolution is obtained, J being great. If the magnetic field homogeneity is good, $\tau_1$ may also be equal to $\tau_3$, which would again lead to a detectable in-phase magnetization.

The coupling partner of undesirable coupled spin systems, any other X magnetization, is eliminated already in the $\tau_2$ interval, as soon as one or more of the $^{13}$C pulses act selectively on a specific X magnetization only, as regards its chemical shift. At the same time, the associated, generally arbitrary, A magnetization is likewise suppressed.

Figure 15:
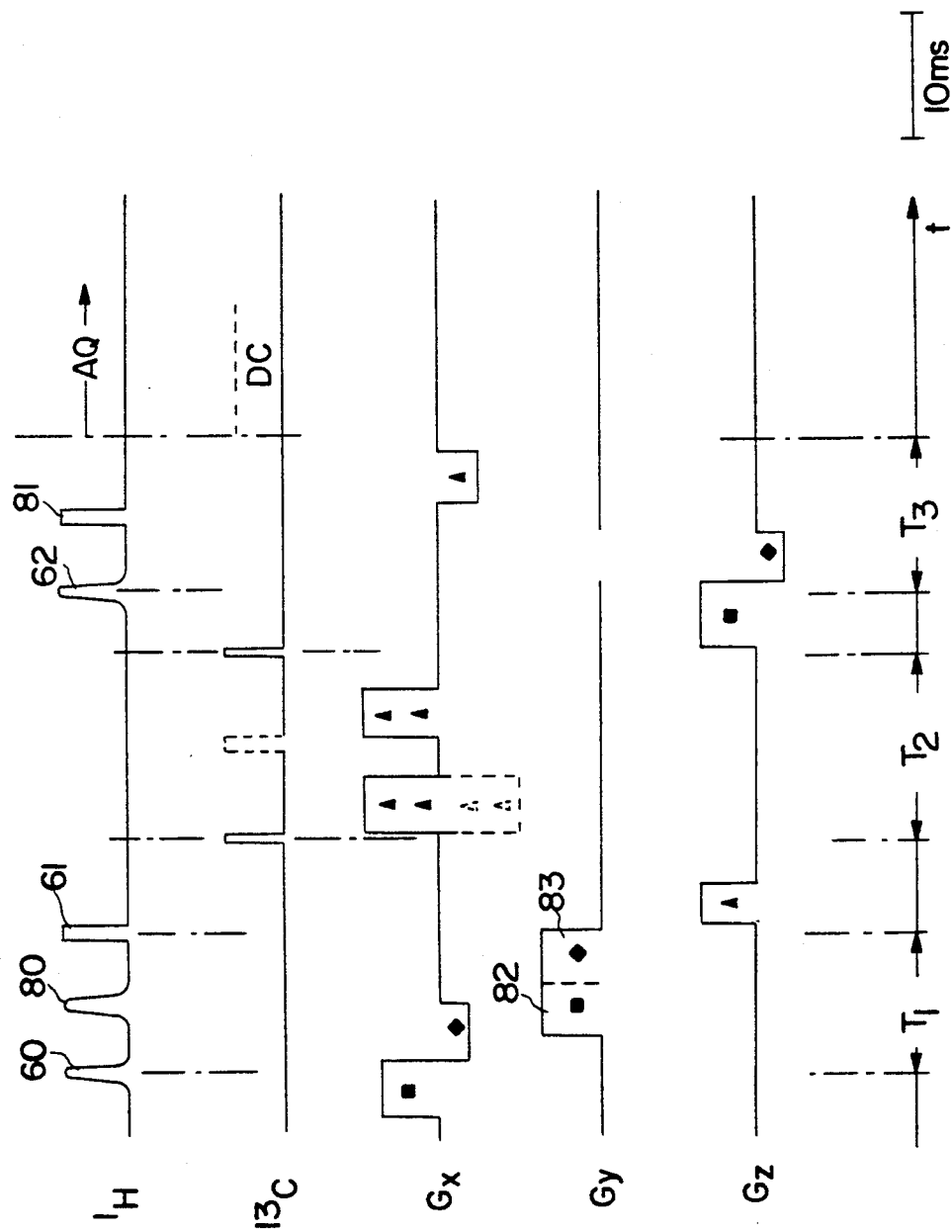
FIG. 15 shows another variant of the pulse program according to FIG. 13.

FIG. 15 finally shows a variant of the pulse sequences illustrated in FIGS. 13 and 14, where - analogously to the manner in which the pulse sequence according to FIG. 11 was modified relative to that illustrated in FIG. 2 - two 180° r.f. pulses 80 (disk-selective) or 81 are introduced between the two first 90° r.f. pulses 60, 61, and following the third 90° r.f. pulses 62, in order to achieve a signal stronger by the factor 2 as compared to the pulse sequence illustrated in FIGS. 13 and 14.

In FIG. 15, it has been indicated by broken lines in both the $^{13}$C axis and the x gradient axis, that this is possible for both pulse sequences, that of FIG. 14 or that of FIG. 14.

Further, it will be noted in FIG. 15 that here, too, the gradients may be modified in the y direction only slightly, as indicated by a disk gradient 82 and a subsequent trim gradient 83 in the y direction.

Figure 16:
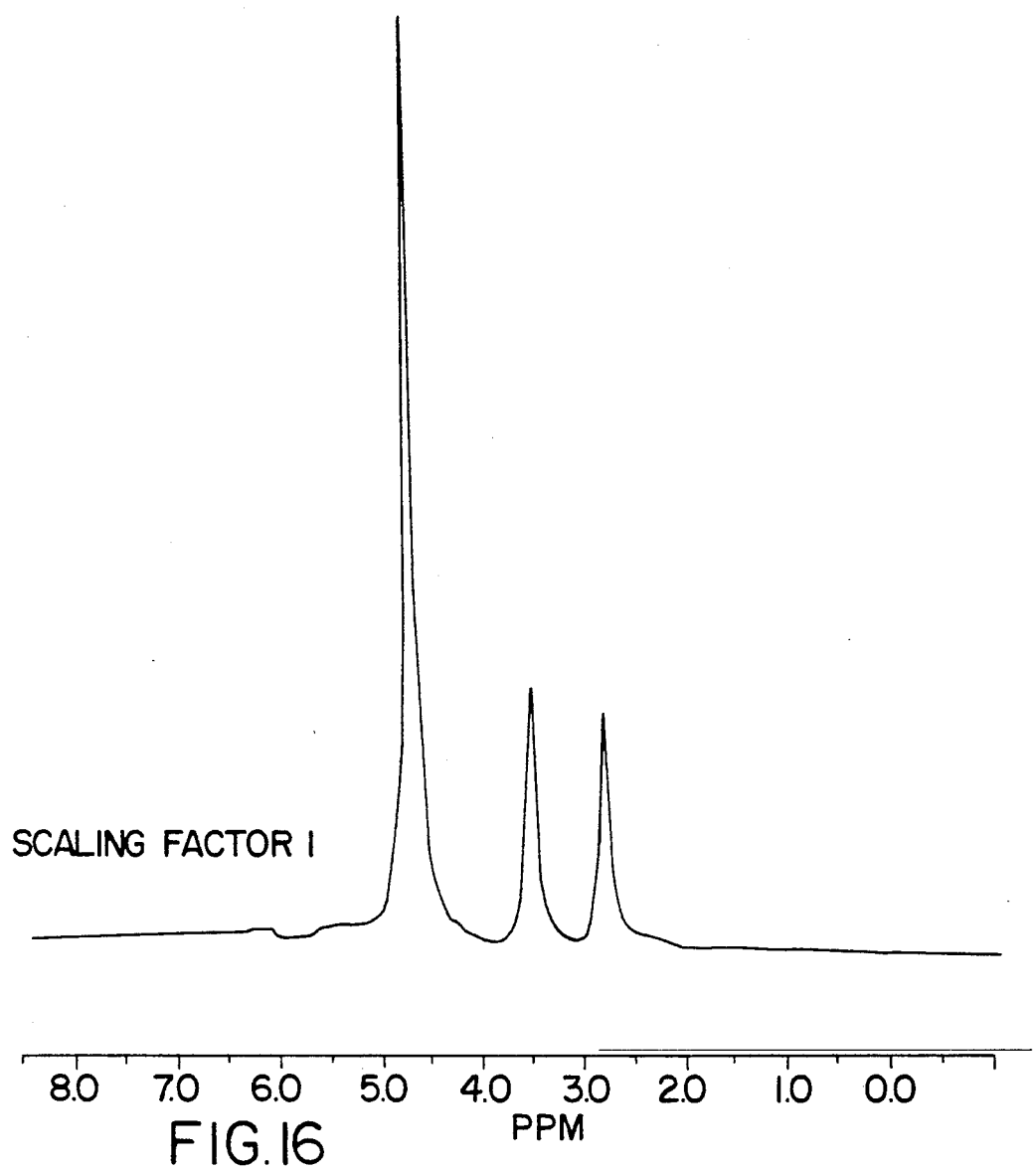
FIG. 16 shows a nuclear resonance spectrum recorded by a method of the prior art on a heteronuclear coupled system.

FIG. 16 shows a nuclear resonance spectrum where a sample similar to that of FIG. 3 has been used, with a ball having a volume of 1 cc was filled with $^{13}$C-enriched methanol and surrounded by water. The nuclear resonance spectrum of FIG. 16 was recorded from a single pass using a non-editing three-pulse sequence according to the prior art, at a magnetic field strength of 4.7 T.

Figure 17:
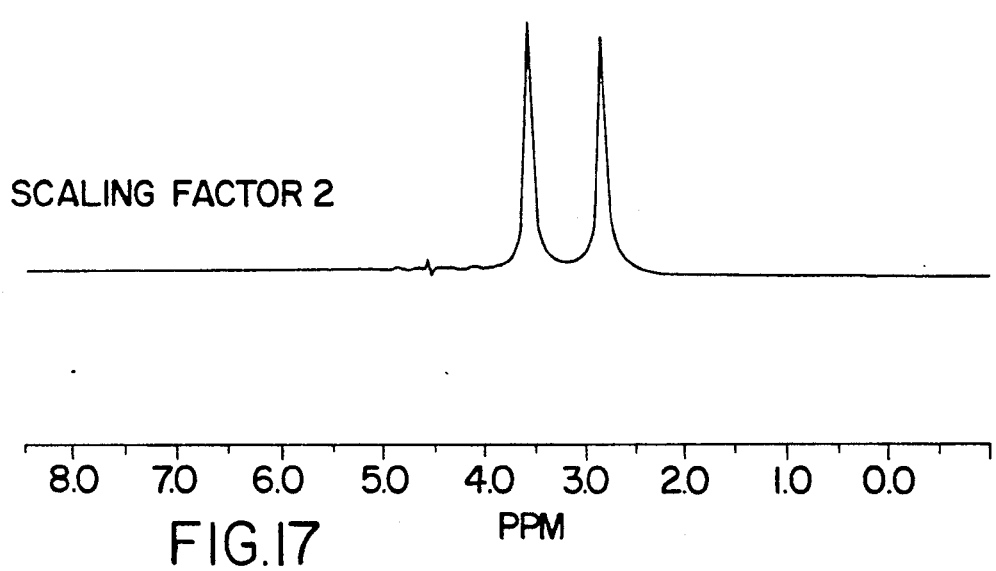
FIG. 17 shows a nuclear resonance spectrum similar to that of FIG. 16, but recorded with the aid of the method according to the invention as illustrated in FIG. 13.

In contrast, FIG. 17 shows a nuclear resonance spectrum recorded with the aid of a pulse sequence according to FIG. 13. It will be noted that the $CH_3$ signal at 3 ppm (double scaling factor) is approximately as high as that of FIG. 16, whereas the uncoupled spins at 4.7 ppm have practically disappeared.

I claim:

1. Method for recording nuclear resonance spectra of test samples (30, 40) having at least three groups (A, B, X) of nuclei of the same kind, the first group (A) being coupled to a second group (X), while a third group (B) is uncoupled relative to the second group (X) but has a chemical shift which is substantially identical only to that of the first group (A), the method comprising the step of suppressing the signal of the third group (B) for the purpose of obtaining an isolated image of the signal of the first group (A), wherein a pulse sequence of three r.f. pulses (10, 13, 22), preferably 90° r.f. pulses, are irradiated upon the said sample (30; 40), the said second r.f. pulse (13) is applied in such a way that the magnetization of the nuclei of the first group (A) is transferred to the nuclei of the second group (X) by polarization transfer, a first magnetic gradient field pulse (17), with dephasing effect for the nuclei of the said second group (X), is exerted upon the said sample (30; 40) in the time interval ($\tau_2$) between the second r.f. pulse (13) and the third r.f. pulse (22), the third r.f. pulse (22) is adjusted in such a way that the magnetization of the nuclei of the said second group (X) is retransferred to the nuclei of the said first group (A) by polarization re-transfer; and thereafter a second magnetic gradient field pulse (17, 23), being rephasing for the nuclei of the first group (A), is exerted upon the said sample (30, 40).

2. Method according to claim 1, wherein the said sample (30; 40) is a lactate sample.

3. Method for recording nuclear resonance spectra of samples having at least three groups (A, B, X) of nuclei, a first group (A) of a first kind of nuclei ($^1$H) being coupled to a second group (X) of a second kind of nuclei, while a third group (B) of the first kind of nuclei ($^1$H) is uncoupled relative to the second group (B), but has a chemical shift which is substantially identical only to that of the first group (A), the method comprising the step of suppressing the signal of the said third group (B) for the purpose of obtaining an isolated image of the signal of the said first group (A), wherein a pulse sequence of five r.f. pulses (60 to 64), preferably 90° r.f. pulses, are irradiated upon the said sample, the second r.f. pulse (61) and a third r.f. pulse (63) are adjusted in such a way that the magnetization of the nuclei of the said first group (A) belonging to the first kind of nuclei ($^1$H) is transferred by polarization transfer to the nuclei of the said second group (X) belonging to the second kind of nuclei ($^{13}$C), at least one first magnetic gradient field pulse (68, 69), with dephasing effect for the nuclei of the said second group (X), is exerted upon the said sample in the time interval ($\tau_2$) between the said third r.f. pulse (63) and the said fourth r.f. pulse (64), a fourth r.f. pulse (64) and a fifth r.f. pulse (62) are adjusted in such a way that the magnetization of the nuclei of the said second group (X) is retransferred to the nuclei of the said first group (A) by polarization re-transfer; and thereafter a second magnetic gradient field pulse (70), being rephasing for the nuclei of the said first group (A), is exerted upon the said sample.

4. Method for recording spin resonance spectra of test samples having at least three groups (A, B, X) of spins, a first group (A) of them being coupled to a second group (X), while a third group (B) is uncoupled relative to the said second group (X) but provides a signal having a spectral position substantially identical only to that of the said first group (A), the method comprising the step of suppressing the signal of the said third group (B) for the purpose of obtaining an isolated image of the signal of the said first group (A), wherein a pulse sequence of at least three r.f. pulses, preferably 90° r.f. pulses, are irradiated upon the said sample, at least the second r.f. pulse is applied in such a way that the magnetization of the spins of the said first group (A) is transferred to the spins of the said second group (X) by polarization transfer, at least one first magnetic gradient field pulse, with dephasing effect for the spins of the said second group (X), is exerted upon the said sample following the said second r.f. pulse, at least another one of the r.f. pulses is adjusted in such a way that the magnetization of the spins of the said second group (X) is retransferred to the spins of the said first group (A) by polarization re-transfer; and finally a second magnetic gradient field pulse, being rephasing for the spins of the said first group (A), is exerted upon the said sample.

5. Method according to one or more of claims 1 to 4, wherein for volume-selective imaging, the said sample (30; 40) is exposed in a conventional manner to a sequence of magnetic gradient field pulses (11, 12, 14, 15, 17, 18, 19, 20, 21, 23, 24; 66 to 76) of different coordinate directions (x, y, z), and at least three of the said r.f. pulses (10, 13, 22; 60, 61, 62) are adjusted in a disc-selective manner.

6. Method according to one or more of claims 1 to 5, wherein another r.f. pulse, being selective for the nuclei of the said second group (X) with respect to the chemical shift, preferably a 180° r.f. pulse (16; 65), is irradiated after the said r.f. pulse (13; 63) effecting the polarization transfer.

7. Method according to one or more of claims 1 to 6, wherein prior to irradiating the said first 90° r.f. pulse (10; 60), one exposes the said sample (30; 40) to a r.f. pre-saturating pulse selective for the nuclei or spins of the said second group (X) and for uncoupled nuclei ($H_2O$) or spins, and thereafter to a magnetic gradient field pulse that is dephasing for the nuclei or spins of the said second group (X).

8. Method according to one or more of claims 1 to 7, wherein the said first and the second magnetic gradient field pulse (17, 23; 68/69, 70) are positioned at the time axis (t), relative to the r.f. pulses (13, 22; 61, 62), in such a way that no stimulated echoes of uncoupled spins are generated.

9. Method according to one or more of claims 1 to 8, wherein a 180° r.f. pulse (50, 51; 80, 81) is irradiated upon the said sample (30; 40) in the middle of the time interval between the said first pulse (10; 60) and the r.f. pulse (13; 61) effecting the polarization transfer, and following the r.f. pulse (22; 62) effecting the polarization retransfer.

10. Method according to one or more of claims 1 to 9, wherein the time interval ($\tau_1$) between the said first r.f. pulse (10; 60) and the said second r.f. pulse (13; 61) is selected to be equal to an odd multiple of the reciprocal value of twice the coupling constant (J) between the first group (A) and the second group (X).

11. Method according to one or more of claims 1 to 9, wherein for an $A_nX_2$ system the time interval ($\tau_1$) between the said first r.f. pulse (10; 60) and the said second r.f. pulse (13; 61) is determined according to the formula $$\tau 1 = \frac{1}{\pi J} \text{ arc cot } \frac{1}{\pi J T_2}$$

wherein J is the coupling constant between the said first group (A) and the said second group (X) and $T_2$ is the transversal relaxation time.

12. Method according to one or more of claims 1 to 9, wherein for an $A_nX_2$ system the time interval ($\tau_1$) between the said first r.f. pulse (10; 60) and the said second r.f. pulse (13; 61) is determined according to the formula $$\tau 1 = \frac{1}{2\pi J} \text{ arc cot } \frac{1}{2\pi J T_2}$$

wherein J is the coupling constant between the said first group (A) and the said second group (X) and $T_2$ is the transversal relaxation time.

13. Method according to one or more of claims 3 to 12, wherein the time interval ($\tau_2$) between the third r.f. pulse (63) and the fourth r.f. pulse (64) is selected to be equal to an integer multiple of the said coupling constant (J) between the said first group (A) and the said second group (X).

14. Method according to one or more of claims 5 to 13, wherein for imaging purposes a volume-selective measurement is taken in a conventional manner on a plurality of areas of said the sample (30; 40).

15. A method of recording nuclear resonance spectra of test samples having at least a first, a second and a third group (A, B, X) of nuclei of the same kind, said first group (A) being coupled to said second group (X), while said third group (B) is uncoupled relative to said second group (X) but has a chemical shift being substantially identical only to that of said first group (A), wherein the method, for suppressing signals of said third group (B) for the purpose of obtaining isolated signals of said first group (A), comprises the steps of:

irradiating upon said sample a pulse sequence of a first, a second, and a third r.f. pulse, preferably 90° r.f. pulses, wherein said second r.f. pulse is applied such that the magnetization of the nuclei of said first group (A) is transferred to the nuclei of said second group (X) by polarization transfer;

a first magnetic gradient field pulse being dephasing for the nuclei of said second group (X) is exerted upon said sample in a time interval ($\tau_2$)

between said second r.f. pulse and said third r.f. pulse;

said third r.f. pulse is adjusted such that the magnetization of the nuclei of said second group (X) is re-transferred to the nuclei of said first group (A) by polarization retransfer; and whereafter exerting upon said sample a second magnetic gradient field pulse being rephasing for the nuclei of said first group (A).

16. The method of claim 1, wherein said sample is a lactate sample.

17. The method of claim 15, wherein for volume-selective imaging said sample is exposed to a sequence of magnetic gradient field pulses of different coordinate directions (x, y, z), and at least three of said r.f. pulses are adjusted in a slice-selective manner.

18. The method of claim 15, wherein a fourth r.f. pulse, being selective for the nuclei of said second group (X) with respect to the chemical shift, preferably a 180° r.f. pulse, is irradiated after said second r.f. pulse effecting the polarization transfer.

19. The method of claim 15, wherein prior to irradiating said first 90° r.f. pulse said sample is exposed to a fifth r.f. pre-saturating pulse being selective for the nuclei of said second group (X) and for uncoupled nuclei ($H_2O$) or spins, and whereafter said sample is exposed to a magnetic gradient field pulse being dephasing for the nuclei of said second group (X).

20. The method of claim 15, wherein said first and said second magnetic gradient field pulse are positioned on a time axis (t), relative to said r.f. pulses such that no stimulated echos of uncoupled spins are generated.

21. The method of claim 15, wherein one 180° r.f. pulse each is irradiated upon said sample in the middle of a time interval between said first r.f. pulse and said second r.f. pulse effecting the polarization transfer, and following said third r.f. pulse effecting the polarization re-transfer, respectively.

22. The method of claim 15, wherein a time interval ($\tau_1$) between said first r.f. pulse and said second r.f. pulse is selected to be equal to an odd multiple of the reciprocal value of twice the coupling constant (J) between said first group (A) and said second group (X).

23. The method of claim 15, wherein for an $A_n X$ system a time interval ($\tau_1$) between said first r.f. pulse and said second r.f. pulse is determined according to the formula:

$$\tau 1 = \frac{1}{\pi J} \text{ arc cot } \frac{1}{\pi J T_2}$$

where J is the coupling constant between said first group (A) and said second group (X) and $T_2$ is the transversal relaxation time.

24. The method of claim 15, wherein for an $A_n X_2$ system a time interval ($\tau_1$) between said first r.f. pulse and said second r.f. pulse is determined according to the formula:

$$\tau 1 = \frac{1}{2\pi J} \text{ arc cot } \frac{1}{2\pi J T_2}$$

wherein J is the coupling constant between said first group (A) in said second group (X) and $T_2$ is the transversal relaxation time.

25. The method of claim 17, wherein for imaging purposes a volume-selective measurement is taken on a plurality of areas of said sample.

26. A method of recording nuclear resonance spectra of test samples having at least a first, a second and a third group (A, B, X) of nuclei, said first group (A) of a first kind of nuclei ($^1H$) being coupled to said second group (X) of a second kind of nuclei ($^{13}C$), while said third group (B) is of said first kind of nuclei ($^1H$) and is uncoupled to said second group (B), but has a chemical shift being substantially identical only to that of said first group (A), wherein the method, for suppressing signals of said third group (B) for the purpose of obtaining isolated signals of said first group (A), comprises the steps of:

irradiating upon said sample a pulse sequence of a first, a second, a third, a fourth and a fifth r.f. pulse, preferably 90° r.f. pulses, wherein:

said second r.f. pulse and said third r.f. pulse are adjusted such that the magnetization of the nuclei of said first group (A) belonging to said first kind of nuclei ($^1H$) is transferred by polarization transfer to the nuclei of said second group (X) belonging to said second kind of nuclei ($^{13}C$);

at least one first magnetic gradient field pulse being dephasing for the nuclei of said second group (X), is exerted upon said sample in a time interval ($\tau_2$) between said third r.f. pulse and said fourth r.f. pulse;

said fourth r.f. pulse and said fifth r.f. pulse are adjusted such that the magnetization of the nuclei of said second group (X) is re-transferred to the nuclei of said first group (A) by polarization re-transfer; and thereafter exerting upon said sample a second magnetic gradient field pulse being rephasing for the nuclei of said first group (A).

27. The method of claim 26, wherein for volume-selective imaging said sample is exposed to a sequence of magnetic gradient field pulses of different coordinate directions (x, y, z), and at least three of said r.f. pulses are adjusted in a slice-selective manner.

28. The method of claim 26, wherein a sixth r.f. pulse, being selective for the nuclei of said second group (X) with respect to the chemical shift, preferably a 180° r.f. pulse, is irradiated after said second and third r.f. pulse effecting the polarization transfer.

29. The method of claim 26, wherein prior to irradiating said first 90° r.f. pulse said sample is exposed to a seventh r.f. pre-saturating pulse being selective for the nuclei of said second group (X) and for uncoupled nuclei ($H_2O$) or spins, and whereafter said sample is exposed to a magnetic gradient field pulse being dephasing for the nuclei of said second group (X).

30. The method of claim 26, wherein said first and said second magnetic gradient field pulse are positioned on a time axis (t), relative to said r.f. pulses such that no stimulated echos of uncoupled spins are generated.

31. The method of claim 26, wherein one 180° r.f. pulse each is irradiated upon said sample in the middle of a time interval between said first r.f. pulse and said second and third r.f. pulse effecting the polarization transfer, and following said fourth and fifth r.f. pulse effecting the polarization re-transfer, respectively.

32. The method of claim 26, wherein a time interval ($\tau_1$) between said first r.f. pulse and said second r.f. pulse is selected to be equal to an odd multiple of the reciprocal value of twice the coupling constant (J) between said first group (A) and said second group (X).

33. The method of claim 26, wherein for an $A_n X$ system a time interval ($\tau_1$) between said first r.f. pulse and said second r.f. pulse is determined according to the formula:

$$\tau 1 = \frac{1}{\pi J} \text{ arc cot } \frac{1}{\pi J T_2}$$

where J is the coupling constant between said first group (A) and said second group (X) and $T_2$ is the transversal relaxation time.

34. The method of claim 26, wherein for an $A_n X_2$ system a time interval ($\tau_1$) between said first r.f. pulse and said second r.f. pulse is determined according to the formula:

$$\tau 1 = \frac{1}{2\pi J} \text{ arc cot } \frac{1}{2\pi J T_2}$$

wherein J is the coupling constant between said first group (A) in said second group (X) and $T_2$ is the transversal relaxation time.

35. The method of claim 26, wherein a time interval ($\tau_2$) between said third r.f. pulse and said fourth r.f. pulse is selected to be equal to an integer multiple of the coupling constant (J) between said first group (A) and said second group (X).

36. The method of claim 27, wherein for imaging purposes a volume-selective measurement is taken on a plurality of areas of said sample.

37. A method of recording spin resonance spectra of test samples having at least three groups (A, B, X) of spins, a first group (A) of spins being coupled to a second group (X), while a third group (B) is uncoupled to said second group (X) but is associated to signals having a spectral position substantially identical only to that of said first group (A), wherein the method, for suppressing signals of said third group (B) for the purpose obtaining isolated signals of said first group (A) comprises the steps of:
  irradiating upon said sample a pulse sequence of at least a first, a second and a third r.f. pulse, preferably 90° r.f. pulses, wherein
    at least said second r.f. pulse is applied such that the magnetization of the spins of said first group (A) is transferred to the spins of said second group (X) by polarization transfer,
    at least one first magnetic gradient field pulse, being dephasing for the spins of said second group (X), is exerted upon said sample following said second r.f. pulse;
    at least another one of said r.f. pulses is adjusted such that the magnetization of the spins of said second group (X) is re-transferred to the spins of said first group (A) by polarization re-transfer; and
  exerting upon said sample a second magnetic gradient field pulse being rephasing for the spins of said first group (A).

* * * * *